Sept. 25, 1962 A. STEVENSON ETAL 3,055,776

MASKING TECHNIQUE

Filed Dec. 12, 1960 2 Sheets-Sheet 1

ALDEN STEVENSON,
THOMAS C. HALL,
INVENTORS.

By Spensley and Horn
ATTORNEYS.

ALDEN STEVENSON,
THOMAS C. HALL,
INVENTORS.

BY Spensley and Horn

ATTORNEYS.

United States Patent Office 3,055,776

Patented Sept. 25, 1962

3,055,776

MASKING TECHNIQUE

Alden Stevenson and Thomas C. Hall, Rolling Hills, Calif., assignors to Pacific Semiconductors, Inc., Culver City, Calif., a corporation of Delaware Filed Dec. 12, 1960, Ser. No. 75,449
15 Claims. (Cl. 117—212)

This invention relates to semiconductor devices and methods for producing the same.

This application is a continuation-in-part of copending United States patent application Serial No. 750,077, entitled "Masking Technique," by T. C. Hall and A. Stevenson, filed July 21, 1958, now abandoned, and assigned to the present assignee.

More particularly, this invention provides a new and improved method for localizing the introduction of active impurities into a predetermined portion of the surface of a body of semiconductor material.

In the semiconductor art a region of semiconductor material containing an excess of donor impurities and having an excess of free electrons is considered to be an N-type region, while a P-type region is one containing an excess of acceptor impurities resulting in a deficit of electrons, or stated differently, an excess of holes. When a continuous solid specimen of semiconductor material has an N-type region adjacent a P-type region the boundary between them is termed a P-N (or N-P) junction and the specimen of semiconductor material is termed a P-N junction semiconductor device. A specimen having two N-type regions separated by a P-type region, for example, is termed an N-P-N junction semiconductor device or transistor, while a specimen having two P-type regions separated by an N-type region is termed a P-N-P junction semiconductor device or transistor.

The term semiconductor material as utilized herein is considered generic to germanium, silicon, germanium-silicon alloy, indium-antimonide, gallium-antimonide, aluminum-antimonide, indium-arsenide, gallium-arsenide, gallium-phosphorus alloys, and indium-phophorus alloys and the like, and is employed to distinguish these semiconductors from metallic oxide semiconductors such as copper oxide and selenium.

In accordance with present practices in the semiconductor art, P-N junction devices are produced by fusing small amounts of a low melting point active impurity within a portion of a semiconductor starting specimen or crystal body. According to this prior art fusion method a predetermined amount of a low melting point active impurity such as indium either in elemental form or in a compound, for example, is placed in contact with the surface of an N-type germanium specimen, for example. The specimen and the contacting indium are then heated to a value of temperature above the melting point of indium but below the melting point of the germanium specimen in order to melt the indium and dissolve therein some atoms of germanium adjacent to the indium. The specimen is then cooled so that the dissolved atoms of germanium together with the indium atoms are regrown onto the specimen thereby producing an indium saturated P-type region in the semiconductor specimen.

This invention is especially applicable to processes which involve vapor-solid diffusion into a body of semiconductive material such as silicon, for example. One such method is disclosed in U.S. Patent No. 2,827,403, issued March 18, 1958, for "Method for Diffusing Active Impurities Into Semiconductor Materials," by T. C. Hall and C. A. Levi. In accordance with well known diffusion techniques such as that above described in the Hall and Levi patent, the semiconductive body is exposed to a vapor which includes a conductivity-type determining impurity, often referred to as an active impurity, which vapor diffuses into the body without significant melting of the body.

In the production of semiconductor diodes or transistors, the junction area may have to be controlled within relatively colse limits, whether the junction is produced by the fusion or diffusion methods hereinabove mentioned. In order to localize the diffusion of active impurities into a semiconductor specimen to a predetermined portion thereof some sort of mask against diffusion must be applied to the surface of the specimen in question. It is well known that a film of silicon dioxide of a thickness in the range from 3000 A. to 4000 A. may be used to inhibit the penetration therethrough of diffusing atoms of active impurities. The production of such a silicon dioxide coating on the surface of a silicon specimen, for example, has heretofore had certain limiting features.

While it is true that pure silicon will oxidize in the ambient to produce a silicon dioxide coating on the surface of the silicon, the thickness of such a coating at room temperature will not usually exceed 50 A. which is far too thin to act as an effective mask. It has been found that in order to produce a sufficiently thick silicon dioxide coating on the surface of a silicon wafer, i.e., 3000 A., a specimen must be subjected to a temperature of approximately 1200° C. for one hour in air. Such a method is described in U.S. Patent No. 2,802,760 by L. Derick et al., issued August 3, 1957, entitled "Oxidation of Semiconductive Surfaces for Controlled Diffusion." This relatively high heating of the specimen may be undesirable. It has been found that the device characteristics are often unfavorably affected by the subjection of the silicon or other crystal of semiconductive material to a temperature of the order of 1200 C. for any substantial period of time. Further, should the specimen which is to be masked already have an existing P-N junction therein, produced either by the fusion or diffusion method, the penetration of the active impurities existent in the specimen will increase due to diffusion of the impurity atoms deeper into the specimen by thermal agitation of the atoms at the relatively high temperature of 1200° C. or thereabouts. It is therefore desirable to provide a method for establishing, upon the surface of a semiconductive crystal, a coating to serve as a mask which may be produced at a relatively low temperature.

According to the basic concept of the present invention, a silicon bearing compound is used as a source of silicon atoms to provide a silicon oxide coating on the surface of the specimen by the decomposition of the compound in the presence of an oxygen rich atmosphere. More particularly, organic silicon compounds such as non-cross linked linear randomly substituted phenylmethylpolysiloxane oils may be advantageously employed.

More generally the present invention may be carried out by the use of dioxygen substituted silicon compounds having the general formula —O—Si(X)(Y)—O—, where X is either methyl or phenyl and Y is either methyl or phenyl. Thereafter, the mask is removed from all but that portion of the surface of the body which is desired to be masked.

It is therefore an object of the present invention to provide an improved method of masking semiconductive materials against the introduction of active impurities.

Another object of the present invention is to provide an improved method of masking a portion of the surface of the body of semiconductive material against the diffusion of active impurities.

Yet another object of the present invention is to provide an improved method for localizing the diffusion of an active impurity into the surface of a semiconductive crystal without elevating the crystal above a predetermined and relatively low temperature.

A still further object of the present invention is to provide a method for producing a silicon dioxide film at a relatively low temperature on the surface of a portion of a body of semiconductive material to act as a mask against the penetration of an active impurity.

The novel features which are believed to be characteristic of the invention both as to its organization and method of operation, together with further objects and advantages thereof will be better understood from the following description considered in connection with the accompanying drawings in which a specific embodiment of the method of the present invention is illustrated by way of example. It is to be expressly understood, however, that the drawings are for the purpose of illustration and example only and are not intended as a definition of the limits of the invention.

Figure 1:
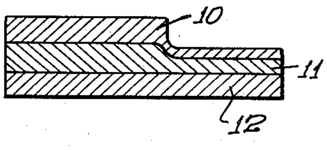
FIGURE 1 is a cross-sectional view of a partially completed semiconductive crystal device in an intermediate stage of production.

In FIGURE 1 there is shown a partially completed transistor in accordance with copending U.S. patent application, Serial No. 725,248 by Mason A. Clark and Alden Stevenson, entitled Diffused Junction Transistor, filed on March 31, 1958, and assigned to the assignee of the present invention. This partially completed device includes an N-type conductivity collector region 11, a P-type conductivity base region 10 and an N conductivity collector contact region 12. It will be assumed that it is next desired to produce an N-type conductivity diffused region 15 within the thinner section of the base region as may be seen in FIGURE 5. In order to limit the diffusion of the N-type conductivity determining impurity to region 15 it is necessary to mask the entire upper surface of the device with the exception of a predetermined portion thereof which is to define the boundary of region 15.

Figure 3:
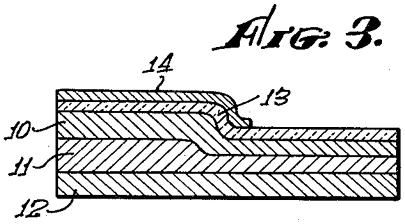
FIGURE 3 is a cross-sectional view of the device of FIGURE 1 showing a mask disposed over only that portion of the coating which is to be retained.
Figure 2:
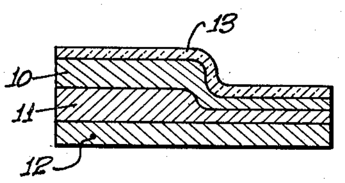
FIGURE 2 is a cross-sectional view of the device of FIGURE 1 showing a coating deposited on the upper surface thereof in accordance with the present invention.
Figure 4:
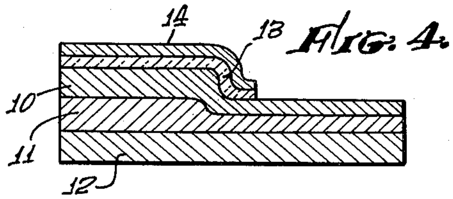
FIGURE 4 is a cross-sectional view of the device of FIGURE 3 after removal of the unmasked portion of the coating.
Figure 5:
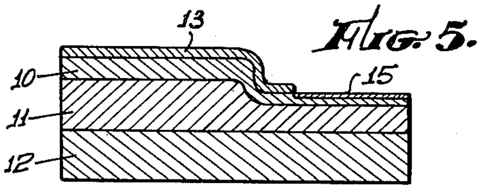
FIGURE 5 is a cross-sectional view of the device shown in FIGURE 4 subsequent to a diffusion operation in the presence of the mask.

The device of FIGURE 1 is next subjected to any of the processes hereinafter to be explained in order to deposit a glass-like coating 13 over the upper surface of region 10 as may best be seen in FIGURE 2. Thereafter a coating 14 which is impervious to hydrofluoric acid, such as ceresin wax, for example, may be disposed over that portion of the device which is desired to be masked. This is shown in FIGURE 3. Hydrofluoric acid or some other etchant which will remove the coating 13 is then applied leaving the device in the position as is indicated in FIGURE 4. Next the wax coating 14 is removed and the assembly of FIGURE 4 is now ready for the production of diffused region 15. One manner in which this might be accomplished would be by the closed tube diffusive technique described and claimed in U.S. Patent No. 2,827,403 supra. In general this technique involves the vapor deposition of an active impurity from a hydride salt from a closed system into the region 15 by diffusion. The impurity will only penetrate region 15 as the remainder of the upper surface of the device is effectively masked. Of course all other surfaces of the device might have the impurity introduced but this is unimportant as such surfaces may later be etched or alternatively if desired could also have been masked in accordance with the present invention. After this diffusion step the completed device will appear as shown in FIGURE 5.

While it has been assumed that the masking method of this invention may be used to limit the diffusion by an active impurity into part of the surface of a base region of a transistor, such is intended by way of example only. The masking method of the present invention is applicable to the production of any type of semiconductor device.

Figure 6:
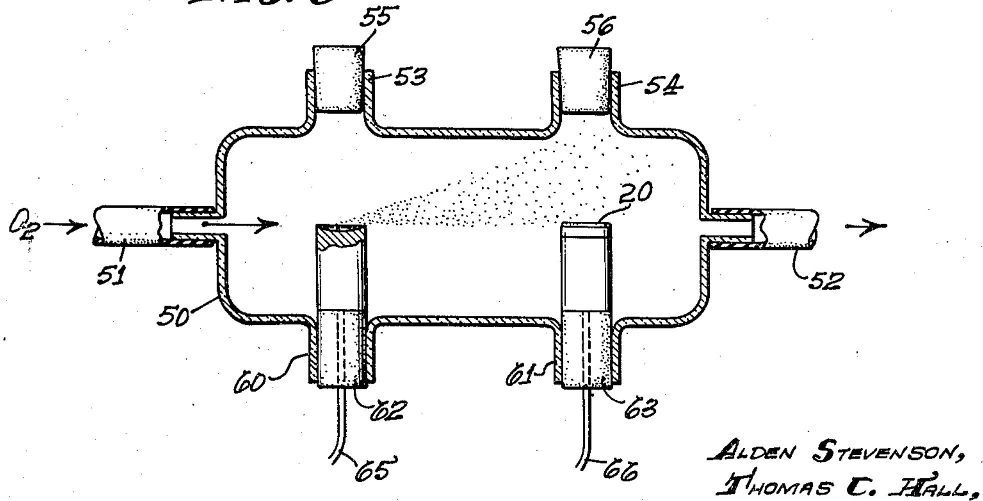
FIGURE 6 is a view, partly in section, of an apparatus which may be used in accordance with the presently preferred method of the present invention.
Figure 7:
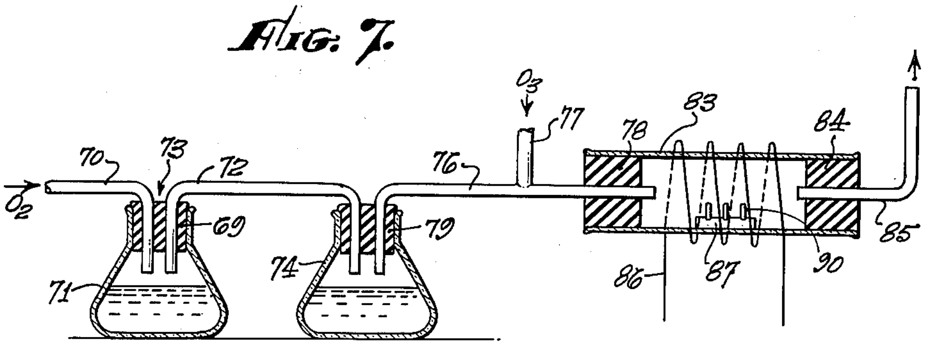
Figure 8:
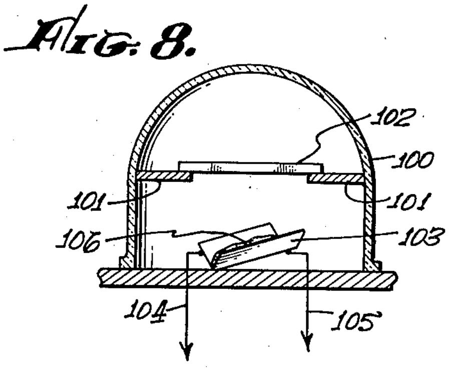

There is shown an apparatus in FIGURE 6 which may be used to carry out the presently preferred method according to the present invention. An open tube quartz container 50 has provided therein an inlet 51 and an outlet 52. Two openings 53 and 54 are provided at the top of the container or chamber 50 and may be sealed by stoppers 55 and 56. Below and aligned with openings 53 and 54 are two other openings 60 and 61. Heater elements 62 and 63 are inserted through opening 60 and 61 and serve to seal these openings from the ambient. Resistance-windings, not shown, are embedded in the heater elements 62 and 63 and are each connected to a source of voltage, not shown, through electrical leads 65 and 66 respectively. The upper end of element 62 has a hemispherical cut out section to accommodate a small quantity of an organic silicon compound, such as a non-cross linked linear randomly substituted phenylmethylpolysiloxane oil. One example of such an oil which has been successfully employed in accordance with the present invention is Dow Corning "DC-703." It is an oil having a viscosity of approximately 6.84 at 210° F. and a density of 1.081 gm./cc. at 77° F. with a phenyl to methyl infra-red absorption ratio of 0.62.

Atop heater element 63 there is placed a partially completed silicon semiconductive device which is to be masked in accordance with the present invention. Thereafter, a source of oxygen, containing approximately 5–20% and usually 10% ozone, is connected to gas inlet 51 so that a highly oxygenated atmosphere will be existent at all times within chamber 50. Each of the heater elements is brought to a temperature of approximately 220° C. at which temperature the oil will vaporize and react with the oxygen and ozone to deposit a layer of a silicon oxide on the wafer 20 which is disposed atop the heater element 63. The oxide which forms may be a completely or incompletely oxidized form of silicon having the general formula $SiO_{2-x}$ where $x$ may vary from 0 to 1. In the case of the polysiloxane deposition mentioned, the hydrocarbon residue of the siloxane may also appear in the layer as a compound having the formula $SiO_{2-x}R_{2x}$ where $x$ has the same range of values previously given and R is a hydrocarbon radical. It should be appreciated, however, that the fundamental masking ability stems from the presence of the silicon oxide and that the hydrocarbon group contributes insubstantially, if at all, to the barrier properties of the mask. While a temperature of 220° C. has been found to be nearly optimum for the oil mentioned, it has been found that any temperature in the range from 70° C. to 300° C. is satisfactory, depending upon the particular polysiloxane oil used. What is required is that the temperature of the heater element associated with the oil be high enough to vaporize it to a degree sufficient to permit a reaction between it and the oxygen and ozone to produce the desired $SiO_{2-x}R_{2x}$ coating upon the semiconductive body. After a period of approximately 10–60 minutes, and usually about 20 minutes, a coating of sufficient thickness (from 0.1 to 1.0 micron) will have been deposited upon the wafer 20. It should be pointed out that while the coating which acts as a mask against diffusion at temperatures in the vicinity of 1000° C. is probably $SiO_2$ and that the silicon oxide portion of the coating produced at the relatively low temperature by the method herein disclosed in composed of $SiO_{2-x}$ (which approaches $SiO_2$ since $x$ is normally a very small number) the coating or film if not already $SiO_2$ will quickly become so upon being heated to the diffusion temperature and therefore act as an effective mask against diffusion.

In addition to non-cross linked linear randomly substituted phenylmethylpolysiloxane oils other silicon-oxygen organic oils may be used in accordance with the present invention method. Thus any dioxygen substituted silicon compound having the general formula —O—Si(X)(Y)—O— where X is either methyl or phenyl and Y is either methyl or phenyl may be used. Examples of such compounds include: methylphenyldiethoxysilane, methylphenyldi-n-propoxysilane, methylphenylsilanediol, diphenylsilanediol, dimethylsilanediol, dimethyldimethoxysilane, dimethyldiethoxysilane, which are monomeric compounds; 1,3-dimethyl-1,3-diphenyldisiloxanediol, 1,1,3,3-tetramethyl-1,3-dimethoxydisiloxane, which are dimeric compounds; trimethyltriphenylcyclotrisiloxane, which is a trimeric compound; and tetramethyltetraphenylcyclotetrasiloxane, which is a tetrameric compound.

Thus it is seen that monomeric as well as poly functional compounds are included.

There has thus been described a new and novel method for localizing the diffusion of active impurities into a semiconductor crystal body.

While the principles of the invention have been set forth, there will be obvious to those skilled in the art, many modifications which are particularly adapted for specific environment and operating requirements. Without departing from those principles the appended claims are therefore intended to cover and embrace any such modifications within the limits only of the true spirit and scope of the invention.

What is claimed is:

1. The method of masking the surface of a body of semiconductive material from penetration by an active impurity at the diffusion temperature of said impurity, said method including the steps of: heating the body to be masked to a temperature in the range from 70° C. to 300° C. in the presence of the vapor of a phenylmethylpolysiloxane in an oxygenated atmosphere.

2. The method of masking a predetermined portion of the surface of a body of semiconductive material from penetration by an active impurity at the diffusion temperature of said impurity, said method including the steps of: heating the body to be masked and a phenylmethylpolysiloxane to a value of temperature in the range from 70° C. to 300° C. in an oxygenated atmosphere thereby to deposit a coating of $SiO_{2-x}R_{2x}$ (where $0<x<1$ and R is a monovalent hydrocarbon residue) upon the surface of said body; and removing said coating from all but said predetermined portion of the surface of said body.

3. The method of masking a predetermined portion of the surface of a body of semiconductive material from penetration by an active impurity at the diffusion temperature of said impurity, said method including the steps of: placing the semiconductor body to be masked and a non cross-linked randomly substituted phenylmethylpolysiloxane into a container; maintaining an oxygenated atmosphere within said container; heating said container to a value of temperature above the decomposition temperature of said phenylmethylpolysiloxane, whereby a coating of $SiO_{2-x}R_x$ (where $0<x<1$ and R is a monovalent hydrocarbon residue) will be deposited upon the surface of said body; and removing said coating from all but said predetermined portion of the surface of said body.

4. The method of fusing a coating of $SiO_{2-x}R_{2x}$ (where $0<x<1$ and R is a hydrocarbon residue) of a thickness in excess of 3000 A. onto the surface of a body of semiconductive material, said method including the steps of: placing the body and a non cross-linked linear randomly substituted phenylmethylpolysiloxane into a container; maintaining an oxygenated atmosphere within said container; and heating the atmosphere within said container to a value of temperature above the decomposition temperature of said phenylmethylpolysiloxane.

5. The method of masking a predetermined portion of the surface of a body of semiconductive material from penetration by an active impurity at the diffusion temperature of said impurity, said method including the steps of: heating the body to be masked and a phenylmethylpolysiloxane to a value of temperature in the range from 70° C. to 300° C. in oxygenated atmosphere which includes ozone thereby to deposit a coating of $SiO_{2-x}R_{2x}$ (where $0<x<1$ and R is a hydrocarbon residue) upon the surface of said body; and removing said coating from all but said predetermined portion of the surface of said body.

6. The method of fusing a coating of $SiO_{2-x}R_{2x}$ (where $0<x<1$ and R is a hydrocarbon residue) of a thickness in excess of 3000 A. onto the surface of a body of semiconductive material, said method including the steps of: placing the body and a non cross-linked linear randomly substituted phenylmethylpolysiloxane into a container; maintaining an oxygenated atmosphere within said container; and heating said phenylmethylpolysiloxane and said body to a value of temperature in the range from 70° C. to 300° C.

7. The method of masking a predetermined portion of the surface of a body of semiconductive material from penetration by an active impurity at the diffusion temperature of said impurity, said method including the steps of: heating the body to be masked and a phenylmethylpolysiloxane to a temperature in the range from 70° C. to 300° C. in an oxidizing atmosphere which includes ozone, thereby depositing a layer of an oxide of silicon upon the surface of said body; and removing said coating from all but said predetermined portion of the surface of said body.

8. The method of masking a predetermined portion of the surface of a body of semiconductive material from penetration by an active impurity at the diffusion temperature of said impurity, said method including the steps of: heating the body to be masked and a phenylmethylpolysiloxane to a temperature in the range from 70° C. to 300° C. in an oxidizing atmosphere which includes ozone thereby producing an atmosphere surrounding said body, which atmosphere is saturated with oxygenated silanes, whereby a coating of an oxide of silicon is deposited upon the surface of said body; and removing said coating from all but said predetermined portion of the surface of said body.

9. The method of masking the surface of a body of semiconductive material from penetration by an active impurity at the diffusion temperature of said impurity, said method including the steps of: heating the body to be masked to a temperature in the range from 70° C. to 300° C. in the presence of a vapor of a dioxygen substituted silicon compound having the general formula —O—Si(X)(Y)—O— (where X is selected from the class consisting of methyl and phenyl and Y is selected from the class consisting of methyl and phenyl) in an oxygenated atmosphere.

10. The method of masking a predetermined portion of a surface of a body of semiconductive material from penetration by an active impurity at the diffusion temperature of said impurity, said method including the steps of: heating the body to be masked and a dioxygenated silicon compound having the general formula —O—Si(X)(Y)—O— (where X is selected from the class consisting of methyl and phenyl and Y is selected from the class consisting of methyl and phenyl) to a value of temperature in the range of from 70° C. to 300° C. in an oxygenated atmosphere thereby to deposit a coating of $SiO_{2-x}R_{2x}$ (where $0<x<1$ and R is a monovalent hydrocarbon residue) upon the surface of said body; and removing said coating from all but said predetermined portion of the surface of said body.

11. The method of fusing a coating of $SiO_{2-x}R_{2x}$ (where $0<x<1$ and R is a monovalent hydrocarbon residue) of a thickness in excess of 3000 A. onto the surface of a body of semiconductive material, said method including the steps of: placing the body and a dioxygenated silicon compound having the general formula —O—Si(X)(Y)—O— (where X is selected from the class consisting of methyl and phenyl and Y is selected from the class consisting of methyl and phenyl) into a container; maintaining an oxygenated atmosphere within said container; and heating the atmosphere within said container to a value of temperature above the decomposition temperature of said compound.

12. The method of masking a predetermined portion of the surface of a body of semiconductive material from penetration by an active impurity at the diffusion temperature of said impurity, said method including the steps of: heating the body to be masked in a dioxygenated silicon compound having a general formula —O—Si(X)(Y)—O— (where X is selected from the class consisting of methyl and phenyl and Y is selected from the class consisting of methyl and phenyl) to a value of temperature in the range from 70° C. to 300° C. in an oxygenated atmosphere which includes ozone thereby to deposit a coating of $SiO_{2-x}R_{2x}$ (where $0<x<1$ and R is a monovalent hydrocarbon residue) upon the surface of said body; and removing said coating from all but said predetermined portion of the surface of said body.

13. The method of fusing a coating of $SiO_{2-x}R_{2x}$ (where $0<x<1$ and R is a monovalent hydrocarbon residue) of a thickness in excess of 3000 A. on the surface of a body of semiconductive material, said method including the steps of: placing the body and a dioxygen substituted silicon compound having the general formula —O—Si(X)(Y)—O— (where X is selected from the class consisting of methyl and phenyl and Y is selected from the class consisting of methyl and phenyl) into a container; maintaining an oxygenated atmosphere within said container; and heating said compound and said body to a value of temperature in the range from 70° C. to 300° C.

14. The method of masking a predetermined portion of the surface of a body of semiconductive material from penetration by an active impurity at the diffusion temperature of said impurity, said method including the steps of: heating the body to be masked and a dioxygen substituted silicon compound having the general formula —O—Si(X)(Y)—O— (where X is selected from the class consisting of methyl and phenyl and Y is selected from the class consisting of methyl and phenyl) to a temperature in the range from 70° C. to 300° C. in an oxidizing atmosphere which includes ozone, thereby depositing a layer of an oxide of silicon upon the surface of said body; and removing said coating from all but said predetermined portion of the surface of said body.

15. The method of masking a predetermined portion of the surface of a body of semiconductive material from penetration by an active impurity at the diffusion temperature of said impurity, said method including the steps of: heating the body to be masked and a dioxygen substituted silicon compound having the general formula —O—Si(X)(Y)—O— (where X is selected from the class consisting of methyl and phenyl and Y is selected from the class consisting of methyl and phenyl) to a temperature in the range from 70° C. to 300° C. in an oxidizing atmosphere which includes ozone, thereby producing an atmosphere surrounding said body, which atmosphere is saturated with oxygenated silane, whereby a coating of oxide of silicon is deposited upon the surface of said body; and removing said coating from all but said predetermined portion of the surface of said body.

References Cited in the file of this patent

UNITED STATES PATENTS 2,874,076 Schwartz ---------------- Feb. 17, 1959
2,980,560 Weiser ---------------- Apr. 18, 1961